(12) United States Patent
Sato et al.

(10) Patent No.: US 6,232,777 B1
(45) Date of Patent: May 15, 2001

(54) TUNNELING MAGNETORESISTIVE ELEMENT AND MAGNETIC SENSOR USING THE SAME

(75) Inventors: Toshihiko Sato, Kawaguchi; Ryoichi Nakatani, Urawa; Nobuyuki Inaba, Hasuda, all of (JP)

(73) Assignee: HItachi, Ltd., Tokyo (JP)

( * ) Notice: Subject to any disclaimer, the term of this patent is extended or adjusted under 35 U.S.C. 154(b) by 0 days.

(21) Appl. No.: 09/134,458

(22) Filed: Aug. 14, 1998

(30) Foreign Application Priority Data

Aug. 18, 1997 (JP) .................................................. 9-221501

(51) Int. Cl.[7] .............................. H01L 43/08; G01R 33/09
(52) U.S. Cl. ........................................ 324/252; 360/324.2
(58) Field of Search .................................... 324/252, 331, 324/529, 249; 257/421, 427; 365/173, 171; 428/692; 367/421; 360/324.2

(56) References Cited

U.S. PATENT DOCUMENTS

| 5,712,612 | * | 1/1998 | Lee et al. ............................. | 338/32 R |
| 5,729,410 | * | 3/1998 | Fontana, Jr. et al. ................ | 360/113 |
| 5,862,022 | * | 1/1999 | Noguchi et al. ...................... | 360/113 |
| 5,898,547 | * | 4/1999 | Fontana, Jr. et al. ................ | 360/113 |

OTHER PUBLICATIONS

F. Schelp, et al: "Spin–Dependent Tunneling Between Ferromagnetic Metals in a New Type of Tunnel Junction (Abstract)" Journal of Applied Physics, vol. 81, No. 8, Part 02B, Apr. 15, 1997, pp. 5508 XP000701273.
K. Ono et al., Journal of the Physical Society of Japan, vol. 66, No. 5, May 1997, pp. 1261–1264.
D.V. Averin et al., Plenum Press, New York, 1992, Chap. 6, pp. 217–247.
J.R. Thomas, Journal of Applied Physics, vol. 37, (1966), p. 2914.

* cited by examiner

Primary Examiner—Hezron Williams
Assistant Examiner—Anthony Jolly
(74) Attorney, Agent, or Firm—Kenyon & Kenyon

(57) ABSTRACT

A magnetic sensor is constructed to be capable of detecting the change of tunnel current due to co-tunneling effect at a high S/N ratio by using a tunneling magnetoresistive element having a first magnetic layer of a soft magnetic material formed on a flat substrate, first and second tunnel barrier layers formed on the first magnetic layer, magnetic particles of a ferromagnetic material provided between the first and second tunnel barrier layers, and a second magnetic layer of a soft magnetic material formed on the second tunnel barrier layer so as to create tunneling junctions.

24 Claims, 7 Drawing Sheets

PRIOR ART

TUNNELING MAGNETORESISTIVE ELEMENT AND MAGNETIC SENSOR USING THE SAME

BACKGROUND OF THE INVENTION

The present invention relates to a tunneling magnetoresistive element, and a magnetic sensor using the same.

A remarkable magnetoresistance effect is caused in a small double junction system, and a tunneling magnetoresistive element (TMR) of the small double junction type is proposed according to a known example 1 (K. Ono, Hiroshi Simada, and Youiti Ootuka, "Journal of the Physical Valve Effect and Magneto-Coulomb Oscillations," Journal of the Physical Society of Japan, vol. 66, no. 5, May 1997, pp. 1261–1264).

FIGS. 12A and 12B show the conventional tunneling magnetoresistive element of the known example 1. FIG. 12A is a plan view, and FIG. 12B is a cross-sectional front view. As shown in FIGS. 12A and 12B, soft magnetic layers (electrodes) 200, 201 of Ni are formed on the surface of an insulating layer 10. In addition, tunnel barrier layers (oxide film barriers) 300, 301 are deposited on the soft magnetic layers 200, 201, respectively. A ferromagnetic layer (island) 100 of Co is also formed between the soft magnetic layers 200, 201.

When a voltage V is applied between the soft magnetic layers 200, 201 of this tunneling magnetoresistive element, electrons are injected into one soft magnetic layer 200, tunneling the tunnel barrier layer 300. Thus, a current path is formed which reaches the other soft magnetic layer 201 through the ferromagnetic layer 100 and tunnel barrier layer 301. The current along this path of electrons is called tunneling current I. This system is a double junction system since it includes two tunnel barrier layers 300, 301.

There is another known example 2 (D. V. Averin and Yu. V. Nazarov, "Single Charge Tunneling-Coulomb Blockade Phenomena in Nanostructures," ed. Hermann Grabert and Michel H. Devoret, Plenum Press, New York, 1992, Chap. 6, pp. 217–247). As described in this example, when the conductance property of the small double junction system of this element is measured with the bias voltage V fixed to about zero, the classic tunneling current I does not appear due to Coulomb blockade effect. If the voltage region in which the classic tunneling current I does not appear is called blockade region, the classic tunneling current I exists out of the blockade region, and is substantially proportional to the voltage V. In other words, when the bias voltage V is smaller than a voltage Vc (V<Vc) which separates the blockade region from the outside, or when it is within the blockage region, the I-V characteristic of the small double junction can be expressed by the following equation.

$$I \; 0 \tag{1}$$

In addition, when the bias voltage V is larger than the voltage Vc (V>Vc), or when it is out of the blockade region, the I-V characteristic of the small double junction can be expressed by the following equation.

$$I \; V/(R1+R2) \tag{2}$$

Where R1, R2 is the tunnel resistance.

Even within the blockade region, a tunneling current due to the higher-order term from the viewpoint of quantum mechanics is observed, and this tunneling current I can be expressed by the following equation.

$$I \; \{e^2V^3+(2\pi kT)^2V\}/(R1 \times R2) \tag{3}$$

Where e is the electric charge of an electron, and k is the Boltzmann constant.

This tunneling current I is also called current due to co-tunneling. As will be seen from the above equation (3), if the voltage V is constant, the tunneling current I is reversely proportional to the product of the tunnel resistances R1, R2. In addition, the tunneling current I includes the term proportional to the voltage V and the term proportional to the cube of the voltage V.

The current I due to co-tunneling effect is always present within and out of the blockade region. However, out of the blockade region, the current due to co-tunneling effect is negligibly small as compared with the classic tunneling current. Within the blockade region, since the classic tunneling current associated with the 0-order term is zero (suppressed), the tunneling current due to co-tunneling effect associated with high-order terms is chiefly observed.

The tunnel resistances R1, R2 change depending on the direction in which the magnetization of the ferromagnetic layer 100 is oriented with respect to the magnetization of the soft magnetic layers 200, 201. In other words, the conduction electron spin within the soft magnetic layers 200, 201 of Ni is affected even by an external weak magnetic field, and thus the spin direction is easily changed. The ferromagnetic layer 100 of Co does not easily follow the external weak magnetic field. As a result, the external magnetic field acts to switch the case in which the magnetization of electrons within the soft magnetic layers 200, 201 and the magnetization within the ferromagnetic layer 100 are parallel and the case in which those are antiparallel to each other. Consequently, the tunneling rate in the path from the soft magnetic layer 200, 201 to the ferromagnetic layer 100 or from the ferromagnetic layer to the soft magnetic layer 200, 201 is changed, so that the tunnel resistances R1, R2 are changed by the variation of the external magnetic field. The effect that the tunnel resistances R1, R2 are changed by the external magnetic field is called tunneling magnetoresistance effect. In the tunneling magnetoresistive element shown in FIGS. 12A and 12B, a change of tunneling current due to the tunneling magnetoresistance effect is observed when the external magnetic field is changed.

According to the above-given equations (1) to (3), the tunneling current I due to the co-tunneling effect, which is observed within the blockade region, is reversely proportional to the product of the tunnel resistances R1 and R2, but the classic tunneling current I observed out of the blockade region is only reversely proportional to the sum of the resistances R1 and R2. Accordingly, when the bias voltage V is constant, the tunneling current within the blockade region is more changed by the variation of the external magnetic field than that out of the blockade region. In other words, the change of the resistance R of the whole small double junction specified by the ratio of the voltage V and tunneling current I due to the variation of the magnetic field is more increased, or enhanced within the blockade region. That is, the change of the individual tunnel resistance R1, R2 within the blockade is the same as out of the blockade, while the resistance R of the whole small double junction is observed to be changed, making the current due to the co-tunneling effect be more changed. This effect can be ascribed to the high-order terms of the tunneling phenomenon. Particularly, this effect is formed by a mechanism different from the tunneling magnetoresistance effect that is implicitly associated only with 0-order term. However, since this phenomenon due to the co-tunneling effect is due to part of the whole tunneling phenomenon, this phenomenon is here called the enhancement of magnetoresistance effect based on the co-tunneling effect.

Since the tunneling magnetoresistive element of small double junction type shown in FIGS. 12A and 12B has its magnetoresistance effect resulting from the co-tunneling effect, it must be effectively operated as a single electron device. However, according to the known example 1, the tunneling magnetoresistive element was only operated at a very low temperature of about 20 mK. Moreover, according to the known example 1, the size of the ferromagnetic layer 100 is 150 nm×2500 nm. The size of the ferromagnetic layer 100 is required to be 5×5 nm or below in order to operate at room temperature. Thus, since the request for the operation at room temperature is very difficult to be accepted by the prior art, it is necessary to greatly reduce the size of ferromagnetic layer 100 by a fine working process which is impossible in the prior art.

In addition, the tunneling magnetoresistive element of small double junction type has an impedance higher than the conventional magnetoresistance (MR) effect element and giant magnetoresistance (GMR) effect element. The reason is that the tunnel resistance is required to be much larger than the quantum resistance RK (about 25.8Ω) in order to draw the Coulomb blockade effect. Thus, it is necessary that the tunneling magnetoresistive element be avoided from having the high impedance. If the tunneling magnetoresistive element cannot be fully avoided from the high impedance, a signal detection method different from the conventional one is necessary to use in order to improve the S/N ratio.

SUMMARY OF THE INVENTION

It is an object of the invention to provide the multi-tunneling-junction, tunneling magnetoresistive element, magnetic sensor and magnetic recording sensor head which can be operated at room temperatures, thus solving the above problems.

It is another object of the invention to provide a magnetic sensor, and magnetic recording sensor head which can detect change of tunneling current at a high S/N ratio.

In order to achieve these objects, according to the present invention, a first magnetic layer made of one of a soft magnetic material and a ferromagnetic material is formed on a flat substrate. First and second tunnel barrier layers are deposited on the first magnetic layer. A magnetic particle made of the other one of the soft magnetic material and the ferromagnetic material is provided between the first and second tunnel barrier layers. Then, a second magnetic layer made of the one of the soft magnetic material and the ferromagnetic material is formed on the second tunnel barrier layer.

In this case, the capacitance of the magnetic particles is selected to be 10 aF or below.

The magnetic particle is made a colloidal particle.

Both dielectric material and ferromagnetic material are simultaneously sputtered as targets to deposit a composite film. Then, the composite film is heated to form the first and second tunnel barrier layers and the magnetic particles.

The magnetic particle is a plurality of particles.

The tunneling magnetoresistive element is formed by the multi-tunneling-junction.

A bias voltage is applied to the magnetic sensor using the tunneling magnetoresistive element in order to bring the operating point into the blockade region of the multi-tunneling-junction.

An AC voltage source for applying an AC voltage between the first and second magnetic layers is provided in the magnetic sensor using the tunneling magnetoresistive element. In addition, a high-pass filter is provided in the magnetic sensor in order to produce only the harmonic components including the second harmonic or above of the current response to the AC voltage.

Moreover, the magnetic sensor is used in the magnetic recording sensor head.

DESCRIPTION OF THE PREFERRED EMBODIMENTS

Figure 1:
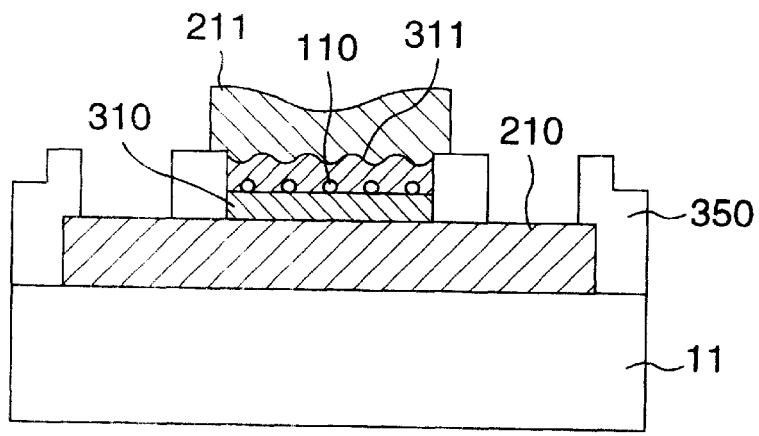
FIG. 1 is a cross-sectional view of a tunneling magnetoresistive element having a multi-tunneling-junction according to the present invention.

FIG. 1 is a cross-sectional view of a tunneling magnetoresistive element having multi-tunneling-junction according to the present invention. As illustrated, a first soft magnetic layer (base electrode) 210 of a soft magnetic material is deposited on a substrate 11 of an insulating layer. An insulating layer 350 is deposited on the substrate 11 and soft magnetic layer 210. First and second tunnel barrier layers 310, 311 of a dielectric thin film are formed on the soft magnetic layer 210 in a region surrounded by the insulating layer 350. Ferromagnetic particles 110 of 10 nm or below in particle size are provided between the tunnel barrier layers 310 and 311. A second soft magnetic layer (top electrode) 211 of a soft magnetic material is deposited on the tunnel barrier layer 311. Thus, the multi-tunneling-junctions (small double junctions) are formed by the soft magnetic layer 210, tunnel barrier layer 310, ferromagnetic particles 110, tunnel barrier layer 311, and soft magnetic layer 211.

A manufacturing method for the tunneling magnetoresistive element of multi-tunneling-junctions shown in FIG. 1 will be described with reference to FIGS. 2 to 6.

Figure 2A:
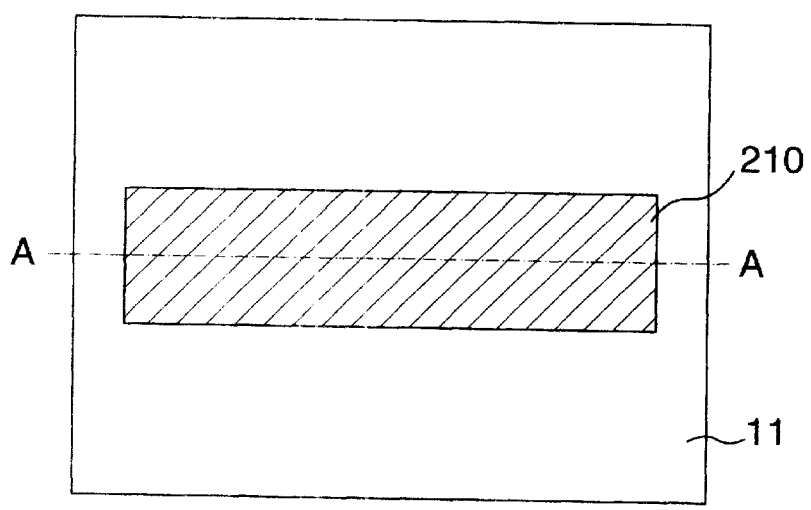
FIGS. 2A and 2B are diagrams to which reference is made in explaining a manufacturing process for the tunneling magnetoresistive element shown in FIG. 1.
Figure 2B:
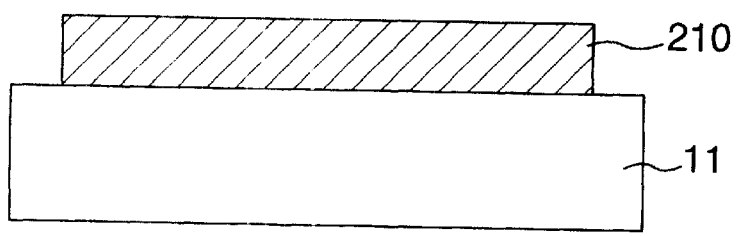

First, as shown in FIGS. 2A and 2B (FIG. 2B is a cross-sectional view taken along a line A—A in FIG. 2A), the soft magnetic layer 210 is deposited on the substrate 11 by photolithography and vacuum evaporation. In this case, the substrate 11 may be an $SiO_2$ film of 400 nm or above in thickness formed on an Si substrate by thermal oxidation. The soft magnetic layer 210 may be an NiFe film, permalloy film or Fe—Al—Si film of about 10 nm in thickness.

Figure 3A:
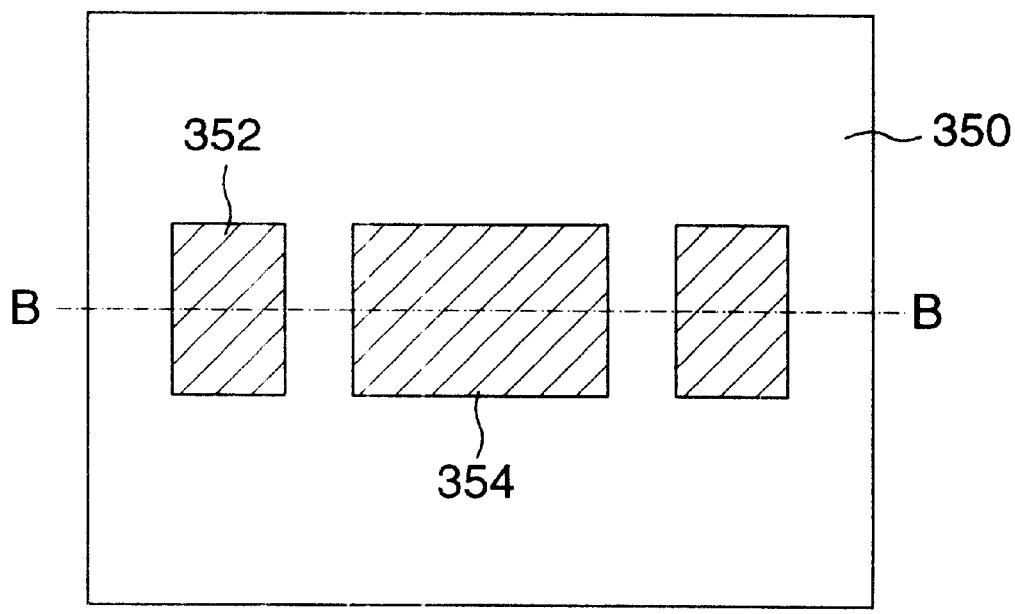
FIGS. 3A and 3B are diagrams to which reference is made in explaining a manufacturing process for the tunneling magnetoresistive element shown in FIG. 1.
Figure 3B:
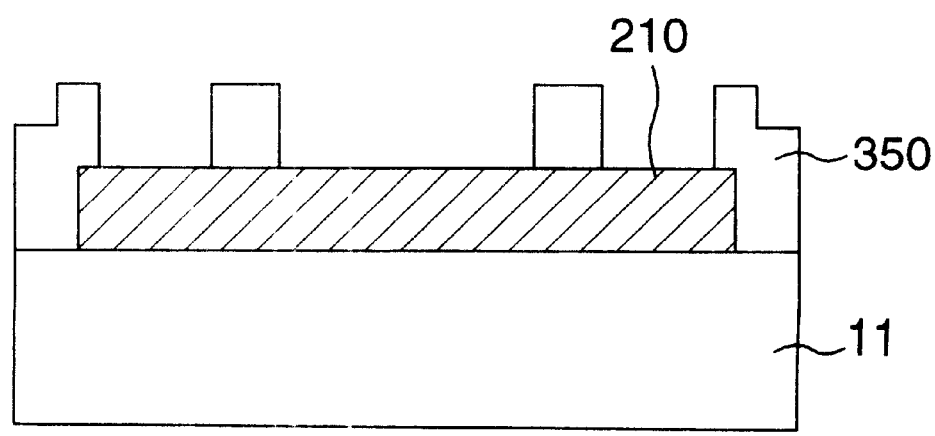

As shown in FIGS. 3A and 3B (FIG. 3B is a cross-sectional view taken along a line B—B in FIG. 3A), the insulating layer 350 is deposited on the substrate 11 and soft magnetic layer 210. In this case, the insulating layer 350 has windows provided for a device creating portion 354 at the center and bond pad creating portions 352 on the left and right sides.

Figure 4A:
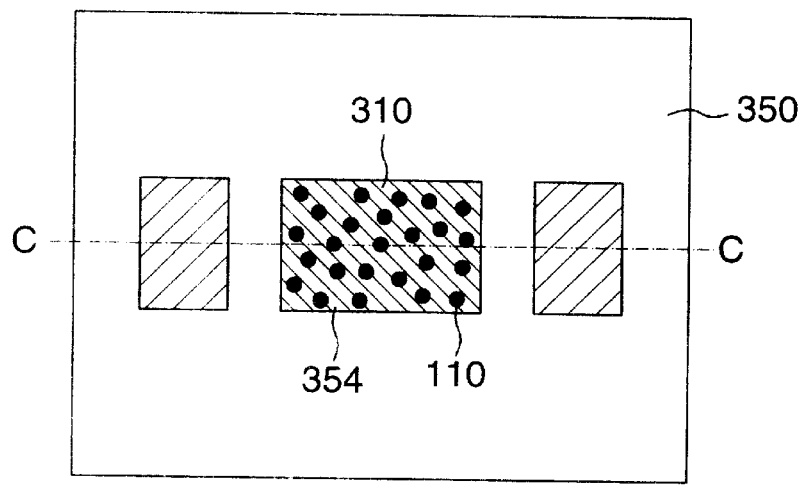
FIGS. 4A and 4B are diagrams to which reference is made in explaining a manufacturing process for the tunneling magnetoresistive element shown in FIG. 1.
Figure 4B:
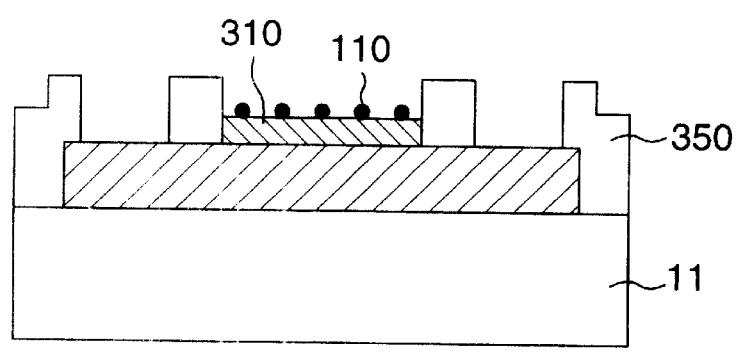
Figure 5:
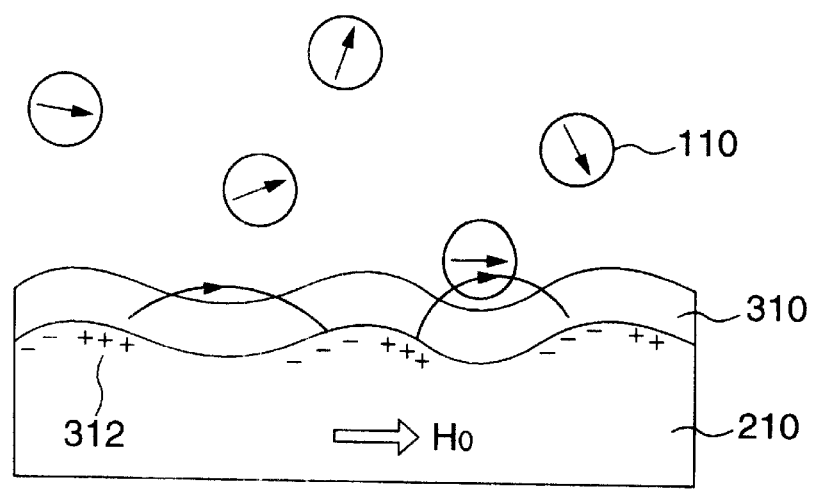
FIG. 5 is a diagram to which reference is made in explaining a manufacturing process for the tunneling magnetoresistive element shown in FIG. 1.

As shown in FIGS. 4A and 4B (FIG. 4B is a cross-sectional view taken along a line C—C in FIG. 4A), the tunnel barrier layer 310 is formed only in the window for the device creating portion 354. In this case, the tunnel barrier layer 310 may be a dielectric thin film such as an aluminum oxide Al—O layer of about 1 nm deposited by sputtering an aluminum oxide target. Then, a single-layer of ferromagnetic particles 110 of 10 nm or below in particle size is deposited on the surface of the tunnel barrier layer 310. In this case, the ferromagnetic particles 110 are cobalt particles contained in a colloidal solution prepared according to the process described in a known example 3 (J. R. Thomas, "Preparation and Magnetic Properties of Colloidal Cobalt Particles," Journal of Applied Physics vol. 37, 2914 (1966)). In other words, the substrate with the tunnel barrier layer 310 just now formed is immersed into the colloidal solution which contains cobalt particles of about 8 nm in diameter covered by the surfactant of polymer molecules, so that only a single layer of ferromagnetic particles 110 (cobalt particles) is deposited on the tunnel barrier layer 310. The time in which the substrate is immersed in the solution is about 24 hours, and during this time, a static magnetic field $H_0$ is kept applied to the substrate in parallel to the substrate surface. Thus, the soft magnetic layer 210 in the static magnetic field $H_0$ parallel to the substrate is magnetized in the direction of static magnetic field $H_0$. However, the surface of the soft magnetic layer 210 formed by sputtering has the roughness of manometer scale as shown in FIG. 5. The soft magnetic material has originally a high permeability. The presence of this roughness causes magnetic poles 312. Thus, a stray field is distributed in the region close to the surface of the soft magnetic layer 210. Since the tunnel barrier layer 310 is thin enough, the stray field can be considered to leak out on the tunnel barrier layer 310. The ferromagnetic particles 110 are magnetized in the direction determined by each crystal orientation. The ferromagnetic particles 110 themselves reach the tunnel barrier layer 310 while making rotation and Brownian motion. Thus, the magnetic moments of the ferromagnetic particles 110 are not always directed in a constant direction. However, after arriving on the surface of the tunnel barrier layer 310, the ferromagnetic particles 110 are attracted by van der Waals force from the tunnel barrier layer 310, and at the same time, subjected to a force of repulsion from the tunnel barrier layer 310 by steric hindrance effect of the surfactant molecules which cover the ferromagnetic particles 110 (cobalt particles). Therefore, the ferromagnetic particles 110 are not strongly restricted to the surface of the tunnel barrier layer 310. The ferromagnetic particles 110 can move around on the surface of the tunnel barrier layer 310. When the ferromagnetic particles 110 reach the place where the stray field from the magnetic poles 312 is present while moving around on the surface of the tunnel barrier layer 310, the magnetization directions of the ferromagnetic particles are made coincident with the direction of the stray field. Thus, the ferromagnetic particles 110 are fixed on the surface of the tunnel barrier layer 310. It is here important that the magnetization directions of the ferromagnetic particles 110 be kept in parallel to the surface of the tunnel barrier layer 310 when fixed to the surface of the tunnel barrier layer 310. According to the method of fixing the ferromagnetic particles 110, the distribution and density of the ferromagnetic particles 110 are determined by the distribution of the magnetic poles 312 due to the roughness of the surface of the soft magnetic layer 210. Consequently, the ferromagnetic particles 110 are uniformly deposited over the entire device creating portion 354 with a spacing of about 20 nm on the average. After the ferromagnetic particles 110 are fixed, the solvent of the colloidal solution is removed.

Figure 6A:
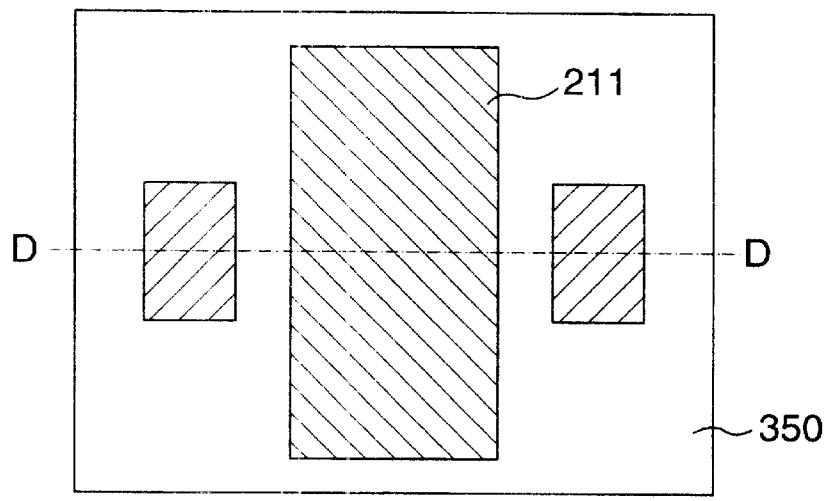
FIGS. 6A and 6B are diagrams to which reference is made in explaining a manufacturing process for the tunneling magnetoresistive element shown in FIG. 1.
Figure 6B:
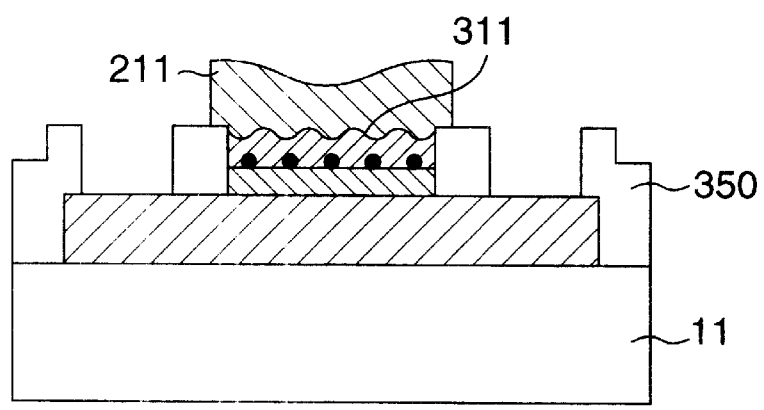

As shown in FIGS. 6A and 6B (FIG. 6B is a cross-sectional view taken along a line D—D in FIG. 6A), the substrate with the ferromagnetic particles 110 attached is subjected to oxygen plasma ashing, so that the surfactant molecules are removed from the surface of the ferromagnetic particles 110 (cobalt particles). Then, the tunnel barrier layer 311 is formed by the same method as is the tunnel barrier layer 310. Also, the soft magnetic layer 211 is deposited. In this case, the soft magnetic layer 211 may be an Ni—Fe film or Fe—Al—Si film of about 10 nm. Lead wires (not shown) are bonded to the soft magnetic layers 210 and 211, and the device is connected to the external circuit through the lead wires.

Here, the size of the ferromagnetic particles 110 is the important parameter. In other words, most particles of ferromagnetic materials lose coercive force and exhibit super paramagnetism at room temperature when their diameter is 3 nm or below. The metal particles of 10 nm or below have a capacitance of about 1 aF ($10^{-18}$ F.). The charging energy calculated from this capacitance is about 100 mev, which is much larger than the thermal exciting energy 25 meV at room temperature. Therefore, in order to obtain the Coulomb blockade effect at room temperature, it is necessary to make the diameter of the ferromagnetic particles 110 equal to or less than 10 nm. Thus, for the purpose of maintaining coercive force, it is required to use ferromagnetic particles 110 of a certain size or above, and for observing the Coulomb blockade effect at room temperature, it is necessary to use the ferromagnetic particles of much small size. That is, the size of the ferromagnetic particles 110 must be selected to satisfy both conditions.

In this tunneling magnetoresistive element, a multi-tunneling-junction is formed through each of the ferromagnetic particles 110 interposed between the tunnel barrier layers 310, 311 which are formed between the soft magnetic layers 210, 211. Thus, since there are a large number of ferromagnetic particles 110, many multi-tunneling-junctions in parallel connect the soft magnetic layers 210, 211.

In addition, considering only one of many multi-tunneling-junctions present between the soft magnetic layers 210, 211, it is assumed that a positive voltage V relative to the soft magnetic layer 210 is applied to the soft magnetic layer 211. In this case, it is important if this voltage is the voltage within or out of the blockade region which the multi-tunneling-junction of interest has. If this voltage is out of the blockade region, electrons are injected into the ferromagnetic particle 110 through the tunnel passing the tunnel barrier layer 310 from the soft magnetic layer 210. Then, electrons are discharged from the ferromagnetic particles 110 to the soft magnetic layer 211 through the tunnel passing the tunnel barrier layer 311. Chiefly, single electron tunnel current formed of classic tunnel current flows. If the voltage V is within the blockade region, the classic tunnel current is suppressed, and chiefly the tunnel current due to co-tunneling effect is observed.

In addition, the soft magnetic layers 21, 211 can be easily magnetized to be inverted by an external field parallel to the film surface. The ferromagnetic particles 110 do not easily follow the external filed since they have fixed magnetization in the crystal structure. The magnetizations of the ferromagnetic particles 110, and soft magnetic layers 210, 211 (the magnetizations of each magnetic layer) have a different response to the external field, thus giving rise to the tunneling magnetoresistance effect. In other words, as the ferromagnetic particles 110 and soft magnetic layers 21, 211 change their magnetization directions, the tunnel resistances R1, R2 of the tunnel barrier layers 310, 311 change according to the change of the magnetization direction. As a result, the tunnel current I flowing in the multi-tunneling-junctions changes. The tunneling magnetoresistance effect of multi-tunneling-junction depends on whether the bias voltage V is within or out of the blockade region. If it is within the blockade region, the effect is enhanced by co-tunneling. In the tunneling magnetoresistive element of multi-tunneling-junction shown in FIG. 1, since the diameter of the ferromagnetic particles is 10 nm or below, a remarkable Coulomb blockade effect can be produced at room temperature. If a voltage within the blockade region is applied at room temperature, a tunnel current due to co-tunneling effect is observed. Thus, the tunnel resistances R1, R2 can be detected. Therefore, the tunneling magnetoresistive element can be operated at room temperature.

The above description is about one multi-tunneling-junction. Since a great number of ferromagnetic particles 110 are present between the soft magnetic layers 210, 211, many multi-tunneling-junctions are formed. The ferromagnetic particles 110 have a uniform diameter. In addition, if both tunnel barrier layers 310, 311 have a uniform film thickness, the characteristics of a large number of multi-tunneling-junctions are uniform. As a result, a great number of multi-tunneling-junctions with uniform characteristics are connected in parallel between the soft magnetic layers 210, 211. Moreover, since the ferromagnetic particles 110 are provided with a spacing of about 20 nm, the mutual action among the multi-tunneling-junctions can be neglected, or the individual multi-tunneling-junctions are independently operated. Therefore, the observed resistance values between the soft magnetic layers 210, 211 correspond to the parallel connection of those independent multi-tunneling-junctions of uniform characteristics. If the window region of the device creating portion 354 is of a square shape of about 2 $\mu$m for each side, the number of multi-tunneling-junctions is 10000 or above. The observed resistance value between the soft magnetic layers 210, 211 is reduced to about 1/1000 that of a single multi-tunneling-junction. In addition, since the characteristics of the multi-tunneling-junctions are uniform, the tunneling magnetoresistance effect due to co-tunneling effect at all multi-tunneling-junctions can be enhanced because the bias voltage within the blockade region is applied to the other multi-tunneling-junctions if the voltage V to a certain multi-tunneling-junction is set within the blockade region.

Figure 7:
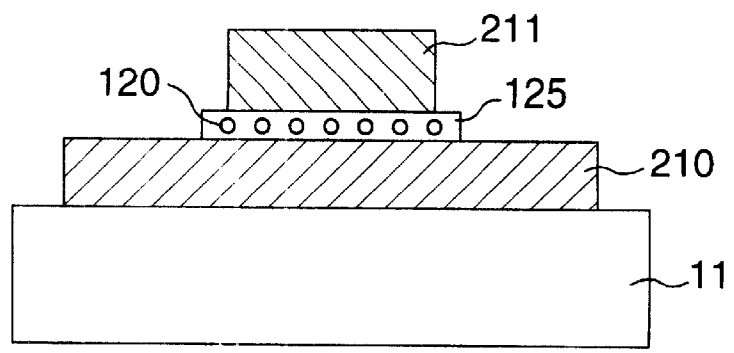
FIG. 7 is a cross-sectional view of another tunneling magnetoresistive element having a multi-tunneling-junction according to the present invention.
Figure 8:
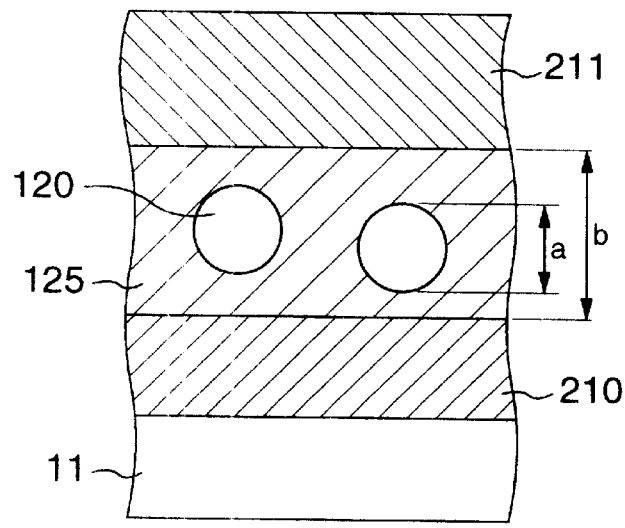
FIG. 8 is a cross-sectional view of part of the tunneling magnetoresistive element shown in FIG. 7.

FIG. 7 is a cross-sectional view of another tunneling magnetoresistive element having multi-tunneling-junction according to the invention. FIG. 8 is a detailed diagram of part of the structure shown in FIG. 7. As illustrated, the soft magnetic layer 210 is deposited on the substrate 11 of an insulating layer. A matrix 125 of aluminum oxide and of about 8 nm in thickness b is formed on the soft magnetic layer 210. In the matrix 125, there are dispersively provided cobalt particles 120 of about 6 nm in diameter a as magnetic particles. The soft magnetic layer 211 is deposited on the matrix 125.

Figure 9A:
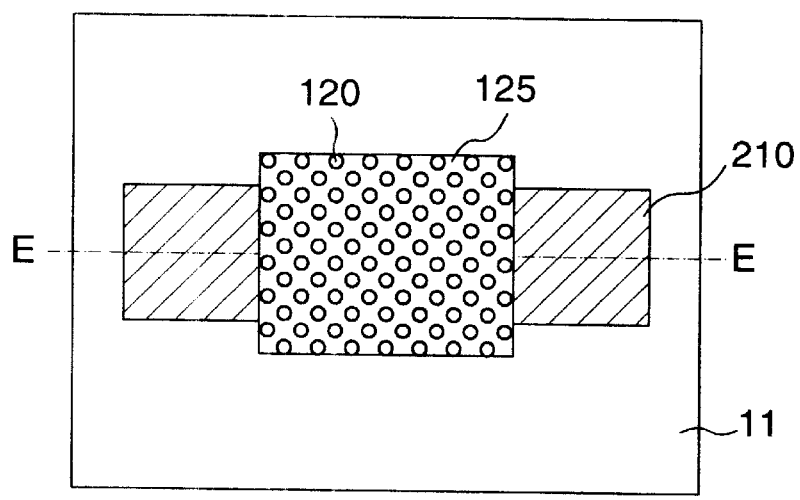
FIGS. 9A and 9B are diagrams to which reference is made in explaining a manufacturing process for the tunneling magnetoresistive element shown in FIG. 7.
Figure 9B:
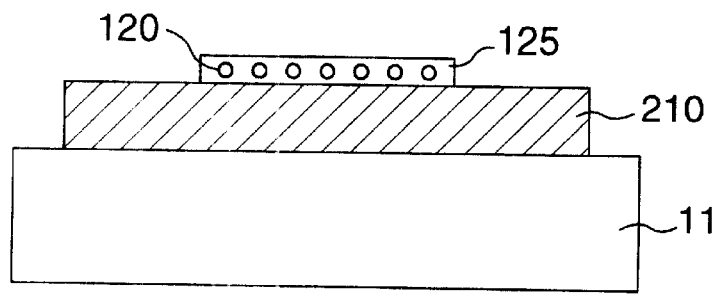
Figure 10A:
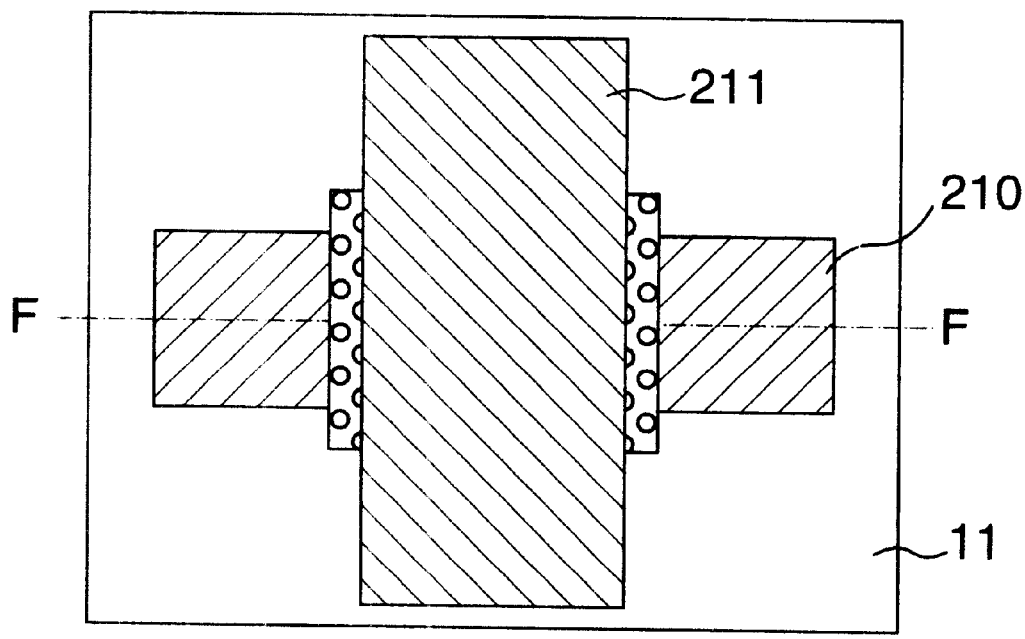
FIGS. 10A and 10B are diagrams to which reference is made in explaining a manufacturing process for the tunneling magnetoresistive element shown in FIG. 7.
Figure 10B:
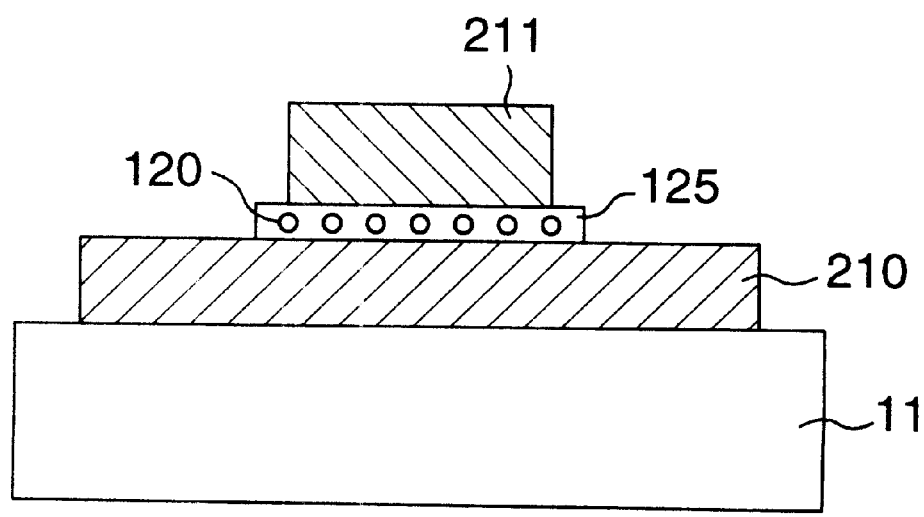

A manufacturing process for the tunneling magnetoresistive element shown in FIGS. 7 and 8 will be described with reference to FIGS. 9A, 9B, 10A and 10B. First, as shown in FIGS. 9A and 9B (FIG. 9B is a cross-sectional view taken along a line E—E in FIG. 9A), the soft magnetic layer 210 is deposited on the substrate 11 by photolithography and vacuum evaporation. Then, aluminum oxide as a dielectric material and cobalt as a ferromagnetic material are simultaneously sputtered as targets to form a composite film of about 8 nm in thickness on the soft magnetic layer 210. A pattern of composite film is formed by lithography, and then the composite is heated to form the matrix 125 with cobalt particles 120 dispersed. As shown in FIGS. 10A and 10B (FIG. 10B is a cross-sectional view taken along a line F—F in FIG. 10A), the soft magnetic layer 211 having a pattern is formed by sputtering and photolithography. Thereafter, lead wires (not shown) are bonded to the soft magnetic layers 210, 211, and this device is connected to an external circuit.

In the tunneling magnetoresistive element of multi-tunneling-junction shown in FIG. 7, the surfaces of the cobalt particles 120 are separated about 1 nm from the soft magnetic layer 210 or 211. Thus, the matrix 125 present between the cobalt particle 120 and the soft magnetic particle 210 or 211 acts as a first or second tunnel barrier layer, making it possible for electrons to tunnel from the soft magnetic layer 210, 211 to the cobalt particles 120. In addition, since the thickness b of the matrix 125 is about 8 nm, only a single layer of cobalt particles 120 can exist between the soft magnetic layers 210, 211. Thus, since the path of tunnel to the cobalt particles 120 is only the path to the soft magnetic layer 210, 211, the multi-tunneling-junctions are formed. In addition, since the cobalt particles 120 are deposited at intervals of about 20 nm on the average, the individual multi-tunneling-junctions can be considered to independently operate. In the tunneling magnetoresistive element of multi-tunneling-junction shown in FIG. 7, it is possible to easily form the first and second tunnel barrier layers of matrix 125, and the magnetic particles of cobalt particles 120.

As a dielectric material, silicon dioxide $SiO_2$ can be used instead of aluminum oxide. As a ferromagnetic material, iron or other alloys can be used in place of cobalt.

The tunneling magnetoresistive elements shown in FIGS. 1 and 7 can be operated as magnetic sensors by applying the voltage V associated with the inside of the blockade region of multi-tunneling-junction to the soft magnetic layers 210, 211, and monitoring the change of tunnel current I to the magnetic field. They can also be operated as magnetic sensors by fixing the tunnel current I and monitoring the voltage V developed between the soft magnetic layers 210, 211. In this case, it is necessary to set the current bias I so that the generated voltage V stays within the blockade region. These magnetic sensors can also be used for magnetic recording sensor heads. In either case, the change of magnetic field is detected as the change of resistance R between the soft magnetic layers 210, 211. According to the experiments by the inventors, the observed resistance value R across the terminals was about several hundreds kΩ. In addition, the resistance R across the terminals was the maximum in the magnetic filed of about 100 Oe. The difference ΔR (=R−Rm) between the resistance R across the terminals and the minimum resistance Rm across the terminals in the external field of 1 kOe or above was about 100 kΩ. The ratio of the difference ΔR to the minimum resistance Rm across the terminals, ΔR/Rm reached 40%. The change of the voltage V across the terminals was about 20 μV.

Let us consider that the relation between the external field and the tunnel current I is measured when a higher voltage V out of the blockade region is applied to the magnetic sensor using the tunneling magnetoresistive element shown in FIG. 1 or 7. As is evident from the equation (3), the tunnel current I includes two components: a component proportional to the voltage V, and a component proportional to the cube of the voltage V. In addition, the classic tunnel current, and the current of electrons passing through the element across the tunnel barrier layers by thermal excitation all include only the component proportional to the voltage V. Therefore, if only the component proportional to the cube of the voltage V can be detected even under the application of a higher voltage out of the blockade region, it is possible to detect only the component due to the co-tunneling effect, or the enhanced tunneling magnetoresistance effect, and to remove the other current components not enhanced.

Figure 11:
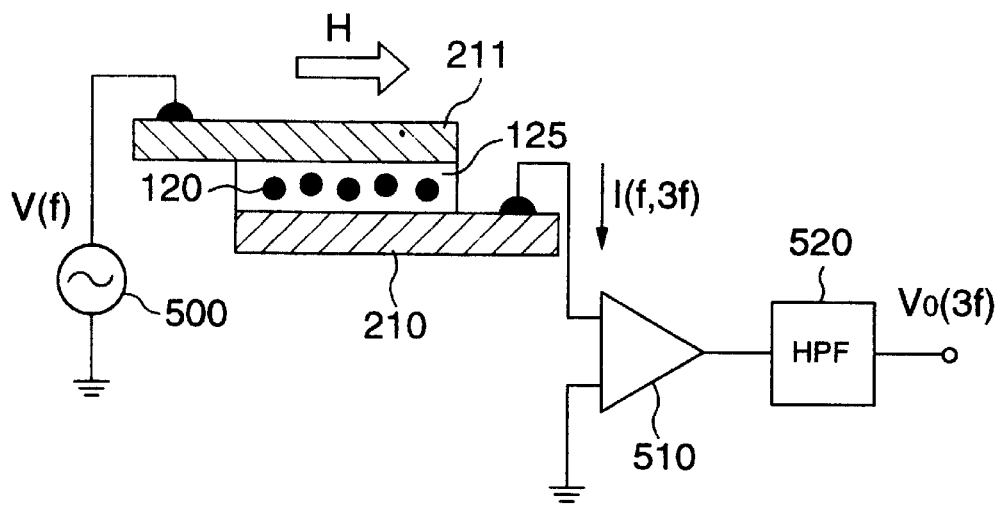
FIG. 11 is a diagram showing a detection circuit system of the magnetic sensor according to the invention.
Figure 12A:
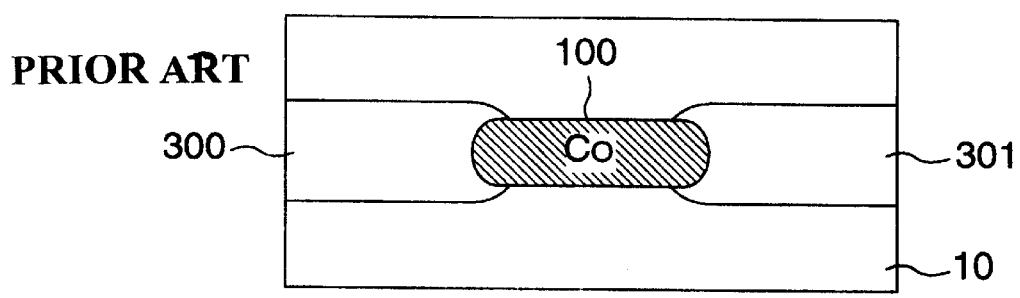
FIGS. 12A and 12B are diagrams showing a conventional tunneling magnetoresistive element.
Figure 12B:
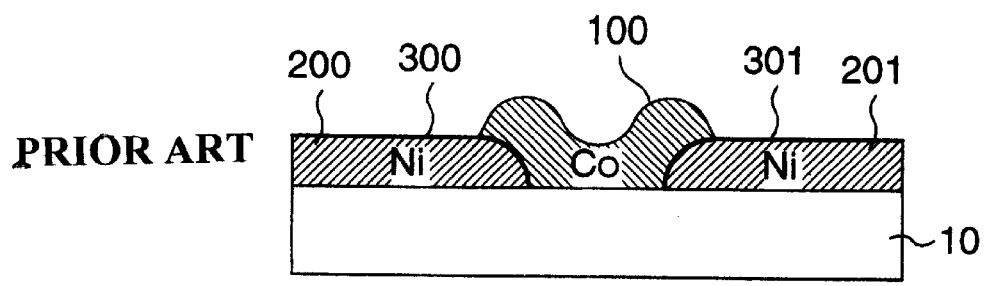

FIG. 11 is a diagram showing a detection circuit system of a magnetic sensor according to the invention. As illustrated, an AC voltage source 500 of frequency f and voltage V (f) is connected to the soft magnetic layer 211, a current detection amplifier 510 connected to the soft magnetic layer 210, and a high-pass filter 520 to the current detection amplifier 510.

In the detection circuit system of this magnetic sensor, the tunnel current I (f, 3 f) (element current) changes when an external field H is changed. The tunnel current I (f, 3 f) contains a component of frequency 3 f due to the term proportional to the cube of the voltage V, and a component of frequency f. However, the output from the current detection amplifier 510 is supplied to the high-pass filter 520, and a signal $V_0$ (3 f) having only the frequency 3 f component is produced by the frequency discrimination. Thus, the circuit system removes the frequency f component containing the signal component in which the tunneling magnetoresistance effect is not enhanced. In addition, if the response of the frequency 3 f component to the change of external field H is treated as a sensor signal, a larger signal component is generated by the higher voltage V out of the blockade region, since the component proportional to the cube of the voltage V suddenly increases with the increase of voltage V. Therefore, the voltage V to be applied to the soft magnetic layers 210, 211 is not necessary to be limited to the inside of the blockade region, and the change of the external field H can be measured at a high S/N ratio raised by about three figures. This magnetic sensor can also be used for the magnetic recording sensor head.

While the above embodiments employ the soft magnetic layers 210, 211 for the first and second magnetic layers, and the ferromagnetic particles 110 of a ferromagnetic material for magnetic particles, it is possible to employ first and second ferromagnetic layers of a ferromagnetic material for the first and second magnetic layers, and soft magnetic particles for the magnetic particles. In this case, the soft magnetic particles follow the external field, and the first and second ferromagnetic layers have fixed magnetization to the crystal structure. In addition, while the above embodiments select the capacitance of the ferromagnetic particles 110 to be about 1 aF, the capacitance of the magnetic particles is selected to be 10 aF or below.

In the tunneling magnetoresistive element of multi-tunneling-junction according to the invention, the Coulomb blockade effect can be attained at room temperature, and thus if a voltage within the blockade region is applied at room temperature, the tunnel resistance can be detected by observing the tunnel current due to the co-tunneling effect. Thus, the tunneling magnetoresistive element can operate at room temperature.

Moreover, the first and second tunnel barrier layers and magnetic particles can be easily formed by simultaneous sputtering of a dielectric material and a magnetic material as targets and heating the composite film deposited by the sputtering.

In addition, by providing a plurality of magnetic particles, it is possible to reduce the resistance between the first and second magnetic layers.

Also, the magnetic sensor and magnetic sensor head can be operated at room temperature by applying a bias voltage within the blockade region of multi-tunneling-junction.

In addition, the change of the tunnel current due to the magnetic field can be detected at a high S/N ratio when the magnetic sensor or magnetic recording sensor head has an AC voltage source provided for applying an AC voltage between the first and second magnetic layers, and a high-pass filter provided for taking out only the harmonic signal component containing frequencies of the second harmonic or above of the current response to the AC voltage.

What is claimed is:

1. A tunneling magnetoresistive element having a first magnetic layer of a soft magnetic material formed on a flat substrate, first and second tunnel barrier layers formed on said first magnetic layer, a magnetic particle of a ferromagnetic material provided between the first and second tunnel barrier layers, and a second magnetic layer of a soft magnetic material formed on said second tunnel barrier layer so as to create tunneling junctions.

2. A tunneling magnetoresistive element according to claim 1, wherein the capacitance of said magnetic particle is selected to be 10 aF or below.

3. A tunneling magnetoresistive element according to claim 1, wherein said magnetic particle is provided between said first and second tunnel barrier layers using a colloidal solution.

4. A tunneling magnetoresistive element according to claim 1, wherein said first and second tunnel barrier layers and said magnetic particle are formed by simultaneously sputtering a dielectric material and a ferromagnetic material as targets to deposit a composite film and heating said composite film.

5. A tunneling magnetoresistive element according to claim 1, wherein a plurality of magnetic particles is provided and said magnetic particle is one of said plurality of magnetic particles.

6. A tunneling magnetoresistive element having a first magnetic layer of a ferromagnetic material formed on a flat substrate, first and second tunnel barrier layers formed on said first magnetic layer, a magnetic particle of a soft magnetic material provided between the first and second tunnel barrier layers, and a second magnetic layer of a ferromagnetic material formed on said second tunnel barrier layer so as to create tunneling junctions.

7. A tunneling magnetoresistive element according to claim 6, wherein the capacitance of said magnetic particle is selected to be 10 aF or below.

8. A tunneling magnetoresistive element according to claim 6, wherein said magnetic particle is provided between said first and second tunnel barrier layers using a colloidal solution.

9. A tunneling magnetoresistive element according to claim 6, wherein said first and second tunnel barrier layers and said magnetic particle are formed by simultaneously sputtering a dielectric material and a ferromagnetic material as targets to deposit a composite film and heating said composite film.

10. A tunneling magnetoresistive element according to claim 6, wherein a plurality of magnetic particles is provided and said magnetic particle is one of said plurality of magnetic particles.

11. A magnetic sensor using a tunneling magnetoresistive element having a first magnetic layer of a soft magnetic material formed on a flat substrate, first and second tunnel barrier layers formed on said first magnetic layer, a magnetic particle of a ferromagnetic material provided between the first and second tunnel barrier layers, and a second magnetic layer of a soft magnetic material formed on said second tunnel barrier layer so as to create tunneling junctions.

12. A magnetic sensor according to claim 11, wherein the capacitance of said magnetic particle is selected to be 10 aF.

13. A magnetic sensor according to claim 11, wherein said magnetic particle is provided between said first and second tunnel barrier layers using a colloidal solution.

14. A magnetic sensor according to claim 11, wherein said first and second tunnel barrier layers and said magnetic particle are formed by simultaneously sputtering a dielectric material and a ferromagnetic material as targets to deposit a composite film and heating said composite film.

15. A magnetic sensor according to claim 11, wherein a plurality of magnetic particles is provided and said magnetic particle is one of said plurality of magnetic particles.

16. A magnetic sensor according to claim 11, wherein a bias voltage within the blockade region of said tunneling junctions is applied.

17. A magnetic sensor according to claim 11, wherein an AC voltage source is provided to apply an AC voltage between said first and second magnetic layers, and a high-pass filter is provided to take out only harmonic signal components having frequencies of second harmonic or above of the response of current to the AC voltage.

18. A magnetic sensor using a tunneling magnetoresistive element having a first magnetic layer of a ferromagnetic material formed on a flat substrate, first and second tunnel barrier layers formed on said first magnetic layer, a magnetic particle of a soft magnetic material provided between the first and second tunnel barrier layers, and a second magnetic layer of a ferromagnetic material formed on said second tunnel barrier layer so as to create tunneling junctions.

19. A magnetic sensor according to claim 18, wherein the capacitance of said magnetic particle is selected to be 10 aF.

20. A magnetic sensor according to claim 20, wherein said magnetic particle is provided between said first and second tunnel barrier layers using a colloidal solution.

21. A magnetic sensor according to claim 18, wherein said first and second tunnel barrier layers and said magnetic particle are formed by simultaneously sputtering a dielectric material and a ferromagnetic material as targets to deposit a composite film and heating said composite film.

22. A magnetic sensor according to claim 18, wherein a plurality of magnetic particles are provided and said magnetic particle is one of said plurality of magnetic particles.

23. A magnetic sensor according to claim 18, wherein a bias voltage within the blockade region of said tunneling junctions is applied.

24. A magnetic sensor according to claim 18, wherein an AC voltage source is provided to apply an AC voltage between said first and second magnetic layers, and a high-pass filter is provided to take out only harmonic signal components having frequencies of second harmonic or above of the response of current to the AC voltage.

* * * * *

UNITED STATES PATENT AND TRADEMARK OFFICE
CERTIFICATE OF CORRECTION

PATENT NO.    : 6,232,777 B1
DATED         : March 15, 2001
INVENTOR(S)   : Sato et al.

It is certified that error appears in the above-identified patent and that said Letters Patent is hereby corrected as shown below:

Column 1,
Line 54, change "I 0" to -- I $\propto$ 0 --.
Line 60, change "I V/(R1+R2)" to -- I$\propto$V/(R1+R2) --
Line 67, after "I" insert -- $\propto$ --.

Column 3,
Line 23, change "avoided" to -- prevented --.
Line 25, change "avoided from" to -- prevented from having --.

Column 6,
Line 47, change "small" to -- smaller --.

Column 7,
Line 9, change "filed" to -- field --.

Column 8,
Line 67, change "filed" to -- field --.

Column 9,
Line 1, change "$\Delta$R(=R-Rm)" to -- $\Delta$R=(R-Rm) --.
Lines 33, 34, 35 and 44, change "3 f" to -- 3f --.
Line 39, change "3 f" to -- 3f -- (two occurrences).

Signed and Sealed this

Twenty-seventh Day of August, 2002

*Attest:*

*Attesting Officer*

JAMES E. ROGAN
*Director of the United States Patent and Trademark Office*